United States Patent

[11] 3,549,899

[72] Inventor Howard R. Beelitz
Princeton, N.J.
[21] Appl. No. 627,399
[22] Filed Mar. 31, 1967
[45] Patented Dec. 22, 1970
[73] Assignee RCA Corporation
a corporation of Delaware

[54] INPUT AND OUTPUT EMITTER-FOLLOWER CML CIRCUITRY
10 Claims, 1 Drawing Fig.

[52] U.S. Cl. .......... 307/215, 307/218
[51] Int. Cl. .......... H03k 19/00
[50] Field of Search .......... 307/214, 215, 218, 239, 254; 328/98; 330/18, 30D

[56] References Cited
UNITED STATES PATENTS

| | | | |
|---|---|---|---|
| 3,182,210 | 5/1965 | Jebens | 307/254 |
| 3,259,761 | 7/1966 | Narud et al. | 307/214 |
| 3,229,217 | 1/1966 | Van Zeeland | 330/18 |
| 3,431,505 | 3/1969 | D'Agostino | 330/30 |
| 3,417,262 | 12/1968 | Yao | 307/215 |

*Primary Examiner*—Donald D. Forrer
*Assistant Examiner*—B. P. Davis
*Attorney*—John V. Regan

ABSTRACT: Current mode switching circuits having at least one input emitter-follower transistor and dual output emitter-follower transistors are described. Power dissipation is considerably reduced by switching a common load current path from one to the other output terminal as determined by the binary significance of the digital input signals, whereby the emitter current of only one of the emitter-follower transistors flows through the common path under steady state conditions.

PATENTED DEC 22 1970
3,549,899
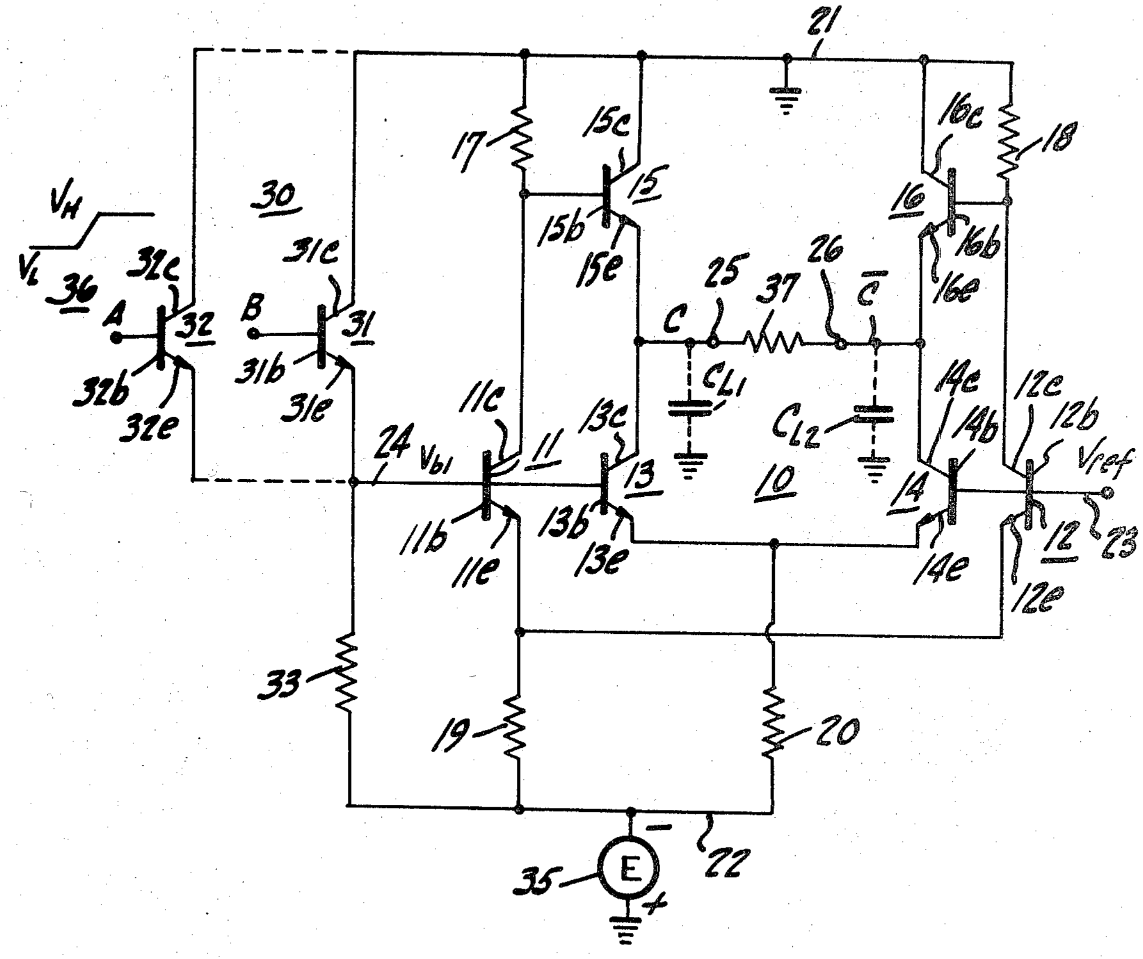
INVENTOR
Howard R. Beelitz
BY John V. Regan
ATTORNEY

INPUT AND OUTPUT EMITTER-FOLLOWER CML CIRCUITRY

BACKGROUND OF INVENTION

The invention herein described was made in the course of or under a contract or subcontract thereunder with the Department of the Air Force.

Current mode switching circuits are well suited for high speed digital systems, for example electronic computers and other electronic apparatus, since the transistors therein can be operated out of saturation with relatively small voltage swings, which may be on the order of a fraction of a volt or so. The avoidance of transistor saturation and the small voltage excursions enable current mode switching circuits to have a high speed of response.

One known type of current mode switching circuit includes at least two transistors having separate collector circuits and a common emitter circuit in which a current source is connected. The current source may be simulated by a source of operating potential and a common signal current path, such as a resistor. The current source current can be routed through either one of the alternate current paths provided by the collector-to-emitter paths of the transistors by application of a suitable difference in potential between the base electrodes thereof. When this type of current mode switching circuit is utilized as a logic gate, the difference in potential is achieved by applying relatively high (HI) and relatively low (LO) binary signal voltage levels to one transistor base electrode and a reference voltage ($V_{ref}$) to the other transistor base electrode. A value intermediate the HI and LO signal levels is assigned to $V_{ref}$, so that the potential difference between the two signal levels and $V_{ref}$ controls which of the transistors the current is routed through. This type of logic gate is sometimes called a current mode logic (CML) gate.

In the usual type CML gate, complementary outputs are taken from the collector electrodes of the two transistors. Each of the complementary outputs is often buffered by a separate emitter-follower (common collector) transistor. The dual emitter-follower transistors provide the CML gate with a low output impedance and provide signal level shift so that the output signal levels are of the same digital voltage levels as the binary input signals. Thus, the output terminals of one CML gate may be directly connected to the input terminals of not only one other CML gate, but also, due to the low output impedance, to the input terminals of several other CML gates.

Although the dual output emitter-follower transistors provide the aforementioned benefits, they also account for about two-thirds of the power dissipation in the CML gate. Although power dissipation is generally undesirable, it is particularly so when the CML gates are fabricated as integrated circuits wherein the dissipated heat can cause serious performance degradation. The present invention is directed to novel improvements in CML gates whereby the power dissipation in the dual output emitter-follower transistors is reduced by a factor of one-half, while retaining both circuit simplicity and high performance.

BRIEF SUMMARY OF INVENTION

According to the invention, the current mode logic circuit described above is improved by providing a load current switch means and a signal translating means which includes at least one emitter-follower transistor. The load current switch means responds to one binary input signal condition to connect a common load current path to one of the output terminals and responds to a different input signal condition to connect the common load current path to the other output terminal. Thus, the emitter current of only one of the dual emitter-follower output transistors flows through the common load current path under steady state conditions.

According to the illustrated example of the invention, the load current switch means is comprised of a pair of transistors having their emitter electrodes connected to the common load current path, their collector electrodes connected to different ones of the output terminals, and their base electrodes connected to different ones of the base electrodes of the two transistors which comprise the input signal current switch. The emitter-follower input transistor enables the input signal current switch and the load current switch to be operated in parallel and without any delay in the switching action of the two switches.

DESCRIPTION OF PREFERRED EMBODIMENTS

Current mode switching circuits according to my invention may be constructed either with discrete components or by means of integrated circuit processes. As used herein, the term, "integrated circuit" refers to those technologies by which an entire circuit can be formed as by diffusion or by films in or on one or more chips of material such as silicon. Current mode switching circuits according to the present invention may either be fabricated on separate chips or fabricated in combination with outer circuitry in or on the same substrate. As the case may be, the integrated circuit structures or chips so formed are useful as building blocks which may be interconnected and combined with appropriate power supplies and signal sources to form various systems.

Referring now to the sole FIG. of the drawing, there is shown generally at 10 a current mode switching circuit according to the invention wherein transistors 11 and 12 comprise an input signal current switch, while transistors 13 and 14 comprise an output or load current switch. The input signal switching transistors 11 and 12 have their collector electrodes 11*c* and 12*c* connected to a first supply connection 21 via collector resistors 17 and 18, respectively. The emitter electrodes 11*e* and 12*e* are connected together and by way of a common signal current path, illustrated as an emitter resistor 19. The other end of common emitter resistor 19 is connected to a second supply connection 22. The base electrode 12*b* is connected to a terminal 23, to which is applied a fixed reference voltage $V_{ref}$.

The base electrode 11*b* is connected to an input connection 24 which is derived from a signal translating circuit 30. The signal translating circuit 30 includes at least one transistor 31 having its collector electrode 31*c* connected to supply connection 21 and its emitter electrode 31*e* connected to connection 24. The connection 24 is connected via an emitter resistor 33 to the supply connection 22. The base electrode 31*b* is connected to receive binary input signals B.

Additional inputs to the current mode switching circuit may be provided by connecting the collector and emitter electrodes of additional transistors across the collector electrode 31*c* and emitter electrode 31*e* of transistor 31. For example, as illustrated by the dashed connections, further transistor 32 has its collector electrode 32*c* connected to collector electrode 31*c* and its emitter electrode 32*e* connected to the emitter electrode 31*c*. The base electrode 32*b* is connected to receive further binary input signals A.

The collector electrodes 11*c* and 12*c* of the input signal current switch are further connected to the base electrodes 15*b* and 16*b* of dual output emitter-follower transistors 15 and 16, respectively. Transistors 15 and 16 have their collector electrodes 15*c* and 16*c* connected to supply connection 21 and their emitter electrodes 15*e* and 16*e* connected to output terminals 25 and 26, respectively, at which complementary output signals C and $\overline{C}$ are developed.

The output or load current switching transistors 13 and 14 have their collector electrodes 13*c* and 14*c* connected to output terminals 25 and 26, respectively, and their emitter electrodes 13*e* and 14*e* connected together and via a common load current path, illustrated as an emitter resistor 20, to the second supply connection 22. The base electrode 14*b* is connected to the $V_{ref}$ terminal 23; while the base electrode 13*b* is connected to the input connection 24.

A suitable source 35 of operating voltage of value E is connected between the supply connections 21 and 22. For the illustrated NPN-type transistors, the source 35 has its negative terminal connected to the supply connection 22 and its positive terminal connected to the supply connection 21, with the supply connection 21 being arbitrarily connected to a suitable reference potential, illustrated as circuit ground by the conventional symbol. It should be apparent that when PNP-type transistors are utilized in the current mode switching circuit the polarity of the source 35 would be reversed.

The binary signals A and B and the output signals C and $\overline{C}$ have the well-known form of HI and LO voltage levels with transitions therebetween as illustrated by the waveform 36 at the base electrode **32*b***.

The fixed reference voltage $V_{ref}$ may be derived from any suitable source. By way of example, $V_{ref}$ could be obtained by means of a temperature compensated voltage divider arrangement connected between supply connections 21 and 22. The reference voltage $V_{ref}$ has a value intermediate the signal swing ($V_{bl}$) levels at base electrode **11*b*. The $V_{bl}$ signal levels are established by the $V_L$ and $V_H$ levels of either A or B shifted in level by the voltage across the base-emitter junction ($V_{be}$) of either transistor 31 or 32**. Thus, the $V_{bl}$ signal swing is between $V_H - V_{be}$ and $V_L - V_{be}$. For the purpose of the following description $V_{ref}$ is assumed to be midway between the $V_{bl}$ levels or $$V_{ref}=\frac{(V_H-V_{be})+(V_L-V_{be})}{2} \quad (1)$$

$$V_{ref}=\frac{V_H+V_L}{2}-V_{be} \quad (2)$$

The output terminals 25 and 26 are shown as connected to loads, illustrated as capacitors $C_{L1}$ and $C_{L2}$. The capacitors $C_{L1}$ and $C_{L2}$ represent the total input capacitance of the input transistors of one or more other driven CML gates and also any other capacitance, such as wiring capacitance, which may be present at the output terminals.

OPERATION

Consider first the circuit operation without regard to the load current switching transistors 13 and 14 and assume that transistors 15 and 16 operate as emitter followers having series-emitter resistors. The common emitter resistor 19 and the voltage source 35 simulate a source of current for the current switching transistors 11 and 12. When either or both of the A and B signals is at the HI voltage level $V_H$, the base voltage $V_{bl}$ is more positive than $V_{ref}$, whereby transistor 11 is turned on and transistor 12 is turned off. The current source current is routed through the collector-emitter path of transistor 11 with the result that the voltage at the collector electrode **11*c* is at a relatively low level; while the voltage at collector electrode 12*c* is at a relatively higher level. These relatively low and high voltage levels are translated with level shift by the base-emitter junctions of transistors 15 and 16 to the output terminals 25 and 26**, respectively, such that the output signals C and $\overline{C}$ are at the LO and HI levels, respectively.

On the other hand when both of the binary signals A and B are at the LO voltage level $V_L$, the base voltage $V_{bl}$ of transistor 11 is less positive than $V_{ref}$, whereby transistor 12 is turned on and transistor 11 is turned off. The current source current is routed through the collector-to-emitter path of the transistor 12 with the result that the voltage at the collector electrode **12*c* is at a relatively low level; while the voltage at collector electrode 11*c* is at a relatively higher level. These relatively high and low voltage levels at the collector electrodes 11*c* and 12*c* are translated with level shift by the base-emitter junctions of emitter-follower transistors 15 and 16 to the output terminals 25 and 26**, respectively, such that the output signals C and $\overline{C}$ are at the HI and LO levels, respectively.

In summary, whenever either or both of the input signals A and B is at the HI level, the output C is at the LO level. It is only when both binary input signals A and B are at the LO level that the output signal C is at the HI level. Of course, the output signal $\overline{C}$ is the complement of the output signal C in each of the above cases. If the binary symbols 1 and 0 are assigned to the HI and LO levels, respectively, the circuit can be said to function as a NOR gate with respect to the output signal C and as a OR gate with respect to the output signal $\overline{C}$.

On the other hand, if the binary symbols 1 and 0 are assigned to the LO and HI levels, respectively, the circuit can be said to function as a NAND gate with respect to the output signal C and as an AND gate with respect to the output signal $\overline{C}$.

In the prior art CML gates wherein emitter-follower transistors 15 and 16 had series-emitter resistors returned at their other ends to the source 35, current flowed in both resistors under steady state conditions to contribute about 67 percent of the total power dissipation of the gate. In the present invention under steady state conditions, the emitter current of only one of the dual emitter-follower transistors flows through the common emitter resistor 20 resulting in a 50 percent reduction of power dissipation in the emitter-follower circuits.

The common emitter resistor 20 and voltage source 35 simulate a further source of current for switching transistors 13 and 14 which respond to the binary input signals A and B to route the current of this further source to either one or the other but not both of the emitter-follower transistors 15 and 16. In essence, the input signal current switch and the load current switch are operated in parallel due to the connections of base electrodes **13*b* and 14*b* to the base electrodes 11*b* and 12*b*, respectively. Thus, when transistor 11 is turned on (A or B at the HI level) and transistor 12 turned off, transistors 13 and 14 are likewise turned on and off, respectively. For the other condition where both A and B are at the LO level, transistors 11 and 13 are turned off and transistors 12 and 14 are turned on. Thus, depending upon the binary signal input conditions, one of the transistors 13 and 14 is turned on to route the current of the resistor 20 and source 35** current source to the associated emitter-follower transistor and output terminal.

It should be noted that although transistor 13 may be turned off ($A=B=V_L$, $C=V_H$) to isolate emitter-follower transistor 15 from common emitter resistor 20, the latter transistor is still conducting (1) to provide a base current path for the input transistors of the CML gates connected to output terminal 25, and (2) to provide a leakage current path for transistor 13. Similar considerations apply to emitter-follower transistor 16 when $\overline{C}=V_H$.

In order to assure a minimum emitter current for the emitter-follower output transistors 15 and 16 during the standby or steady state condition, a resistor network may be inserted to provide a current sink path for such transistors. For example, a single resistor 37 may be connected between the output terminals 25 and 26. Thus, when transistor 13 is turned on and transistor 14 turned off (A or B = $V_H$), a minimum emitter current is assured for the output emitter-follower transistor 16 in the path provided by resistor 37, the collector-emitter path of transistor 13 and resistor 20.

The simplicity of the present invention lies in the mere direct connection via negligible impedance means (such as a conductor) of the base electrodes **13*b* and 14*b* to the base electrodes 11*b* and 12*b***, respectively, so that an input signal current switch and the load current switch are essentially operated in parallel by the same amount of signal swing, i.e., $V_H - V_L$ volts. Thus, the load current switch has the same amount of noise immunity as does the input current switch. In addition, there is no delay between the switching of the input current switch and the load current switch due to the parallel connection.

It should be noted that transistors 31 and 32 reduce the input capacitance of the CML gate of the present invention, as compared to a conventional CML gate without emitter-follower input transistors. First, the emitter-follower input transistors 31 and 32 maintain the base electrodes **11*b* and 13*b*** an additional $V_{be}$ volts below the voltage of the supply connection 21 (0 volt). Thus, there is a higher reverse bias across the collector-base junctions of transistors 11 and 12 by a factor of $V_{be}$ volts such that there is less tendency to saturate and such that the effective collector-to-base capacitance is somewhat smaller. Secondly, the emitter-follower transistors 31 and 32 operate as emitter-followers with respect to the base electrodes 11*b* and 13*b* and thereby tend to reduce the base-to-collector capacitance and other capacitances of the switching transistors 11 and 13 by a factor of $\beta$, as seen in the circuit input. Consequently, faster switching speeds and larger fan-ins are possible without degrading the switching performances of other similar CML gates which supply the input signals A and B.

Although the invention has been illustrated with specific types of current sources, for example resistor 19 and voltage source 35, the current source may take on other forms. For example, the resistor 19 could be replaced by a transistor which is biased in the linear mode to provide a substantially constant current.

While the present invention has been illustrated with bipolar transistors, the invention is not limited to amplifying devices of this type. Other amplifying devices, such as field-effect transistors, may also be employed in the practice of my invention.

I claim:

1. The invention according to claim 7:
- wherein the input signal current switch includes first and second transistors each having base, emitter and collector electrodes and wherein the load current switch includes third and fourth transistors each having base, emitter and collector electrodes;
- wherein the base electrodes of the first and third transistors are connected together to receive binary signals;
- wherein the base electrodes of the second and fourth transistors are connected together and to a point of substantially fixed voltage;
- wherein the input signal current switch includes a common signal current path directly connected to the emitter electrodes of the first and second transistors, and further includes separate current paths coupled to the collector electrodes of the first and second transistors;
- wherein the emitter electrodes of the third and fourth transistors are connected to the relatively constant current source; and
- wherein the collector electrodes of the third and fourth transistors are connected to the first and second output terminals, respectively.

2. The combination as claimed in claim 1 further including a plurality of transistors operated as emitter followers, said transistors having their collector-to-emitter paths connected in parallel, their emitter electrodes being connected in common to the bases of said first and third transistors, and their bases being separately connected to a different one of a plurality of input points to receive binary signals.

3. The invention according to claim 2 wherein each of the transistors is of one conductivity type.

4. The invention according to claim 3 wherein the common signal current path and the common load current path are separate resistors.

5. The invention according to claim 4 wherein a source of operating potential is connected to pass current through each of the resistors.

6. A current mode logic circuit having an input signal current switch with dual output follower-type amplifying devices for producing complementary output signals at first and second output terminals in response to binary input signals applied to the inputs of the input signal current switch; wherein the improvement comprises:
- a common load current path;
- load current switch means having first and second inputs directly connected to the inputs of said signal current switch and responsive to one binary input signal condition to connect the common load current path to the first output terminal and responsive to a different binary input signal condition to connect the common load current path to the second output terminal; and
- a resistor network connected in circuit with said output terminals to provide a minimum output current for the non-connected one of the follower-type devices during the standby condition.

7. A current mode logic circuit having: (a) an input signal current switch with a first input adapted to receive a relatively fixed potential and a second input adapted to receive input signals having either a first value higher than said fixed potential or a second value lower than said fixed potential, and first and second complementary outputs, (b) first and second follower-type amplifying means, both of which are normally forward biased, coupling said first and second differential outputs to first and second output terminals, respectively, for producing complementary output signals at said output terminals having either a "high" or "low" value; wherein the improvement comprises:
- a relatively constant current source;
- means including a load current switch, responsive to said input signals, connecting said current source to that one of the two output terminals which is in the "low" state and disconnecting said current source from that one of the two terminals which is in the "high" state, for speeding the discharge of that terminal whose output potential is falling, and for removing the loading effect of said current source from that terminal whose potential is rising; and
- said load current switch having first and second inputs directly connected to the first and second inputs of the input signal current switch, respectively, whereby the input circuits of the input signal current switch and the load current switch are effectively operated in parallel.

8. A current mode logic integrated circuit formed in a monolithic chip of semiconductor material having: (a) an input signal current switch with a first input adapted to receive a relatively fixed potential and a second input adapted to receive input signals having either a first value higher than said fixed potential or a second value lower than said fixed potential, (b) first and second differential outputs, (c) first and second follower-type amplifying means coupling said first and second follower-type amplifying means coupling said first and second differential outputs to first and second output terminals, respectively, for producing complementary output signals at said output terminals having either a "high" or "low" value; wherein the improvement comprises:
- a relatively constant current source;
- a load current switch responsive to said binary input signals for connecting said current source to that one of said first and second output terminals whose output signal goes "low" and disconnecting said current source from that one of said output terminal whose signal goes "high," whereby only one of the two emitter follower outputs dissipates power on the chip at any one time; and
- said load current switch having first and second inputs directly connected to the first and second inputs of the input signal current switch, respectively, whereby the input circuits of the input signal current switch and the load current switch are effectively operated in parallel.

9. In combination:
- four transistors of the same conductivity type, each having a collector, emitter and base, the first and second being connected emitter-to-collector to form one output terminal, the third and fourth being connected emitter-to-collector to form a second output terminal, the first and third being connected collector-to-collector to form a third terminal and the second and fourth being connected emitter-to-emitter to form a fourth terminal;
- fifth and sixth transistors of the same type as the first four transistors being connected emitter-to-emitter to form a fifth terminal, the fifth connected at its collector to the base of the first transistor and at its base to the base of the second transistor, and the sixth transistor being connected at its collector to the base of the third transistor and at its base to the base of the fourth transistor;

Separate relatively constant current source means connected between said fourth and fifth terminals and a sixth terminal, said third and sixth terminals being adapted for the application therebetween of a source of operating potential; and means for concurrently placing the fifth transistor in its conducting state and the sixth in its nonconducting state to render the third and second transistors conductive and said fourth transistor nonconductive, and for reversing the condition of the fifth and sixth transistors for rendering the first and fourth transistors conductive and the second nonconductive.

10. The combination as set forth in claim 9, wherein each of said current source means includes a resistor.